(12) United States Patent
Maroni et al.

(10) Patent No.: US 10,859,531 B2
(45) Date of Patent: Dec. 8, 2020

(54) IONIZER MONITORING SYSTEM AND ION SENSOR

(71) Applicant: NRD LLC, Grand Island, NY (US)

(72) Inventors: Timothy Maroni, Grand Island, NY (US); Jeremy Paul Willden, Pleasant Grove, UT (US); Martin Robert Johnson, Draper, UT (US); Helaman David Pratt Ferguson, Orem, UT (US); John Patrick Filoso, Pleasant Grove, UT (US); Jonathan Scott Jensen, Pocatello, ID (US); Victor Habinshuti, Williamsville, NY (US); Derek Brim, Buffalo, NY (US); Spencer Ralph Dodge, Sammamish, WA (US); Robert Edmund Gooch, Orem, UT (US); Gary Burridge, Grand Island, NY (US); John M. Glynn, II, Burlington, MA (US)

(73) Assignee: NRD LLC, Grand Island, NY (US)

( * ) Notice: Subject to any disclaimer, the term of this patent is extended or adjusted under 35 U.S.C. 154(b) by 212 days.

(21) Appl. No.: 16/126,157

(22) Filed: Sep. 10, 2018

(65) Prior Publication Data

US 2019/0369051 A1 Dec. 5, 2019

Related U.S. Application Data

(63) Continuation-in-part of application No. 15/954,041, filed on Apr. 16, 2018.

(51) Int. Cl.
*G01N 27/70* (2006.01)
*H05K 7/14* (2006.01)
*H05K 1/18* (2006.01)
*H05K 1/14* (2006.01)
*H05F 3/06* (2006.01)

(52) U.S. Cl.
CPC ............. *G01N 27/70* (2013.01); *H05K 1/144* (2013.01); *H05K 1/18* (2013.01); *H05K 7/1427* (2013.01); *H05F 3/06* (2013.01); *H05K 2201/042* (2013.01); *H05K 2201/10151* (2013.01)

(58) Field of Classification Search
CPC .......... G01N 27/62; G01N 27/70; H05F 3/06; H05K 1/14; H05K 1/181; H05K 5/0026; H05K 2201/10151; H05K 1/141
See application file for complete search history.

(56) References Cited

U.S. PATENT DOCUMENTS

| 4,121,105 A | 10/1978 | Solomon |
| 4,477,263 A | 10/1984 | Shaver et al. |
| 4,542,434 A | 9/1985 | Gehlke et al. |
| 4,809,127 A | 2/1989 | Steinman et al. |

(Continued)

FOREIGN PATENT DOCUMENTS

| CN | 201668763 | 12/2010 | |
| EP | 3620786 A1 * | 3/2020 | ............. G01N 27/70 |

(Continued)

*Primary Examiner* — Adolf D Berhane
(74) *Attorney, Agent, or Firm* — Simpson & Simpson, PLLC; Michael Nicholas Vranjes

(57) ABSTRACT

A sensor for sensing ions, comprising a circuit board assembly, and a core assembly connected to the circuit board assembly, the core including a first electrical conductor and a second electrical conductor.

20 Claims, 12 Drawing Sheets

(56) References Cited

U.S. PATENT DOCUMENTS

| | | | |
|---|---|---|---|
| 4,901,194 A | 2/1990 | Steinman et al. | |
| 4,951,172 A | 8/1990 | Steinman et al. | |
| 4,974,115 A | 11/1990 | Breidegam et al. | |
| 6,052,053 A | 4/2000 | Jubin et al. | |
| 6,078,875 A | 6/2000 | Jubin et al. | |
| 6,252,233 B1 | 6/2001 | Good | |
| 6,717,414 B1* | 4/2004 | Rodrigo | H01T 23/00 324/464 |
| 6,781,811 B2 | 8/2004 | Posadas | |
| 7,427,864 B2* | 9/2008 | Williams | H05F 3/06 250/423 R |
| 7,924,544 B2 | 4/2011 | Richie et al. | |
| 8,861,166 B2 | 10/2014 | Richie, Jr. et al. | |
| 9,404,945 B2 | 8/2016 | Savich | |
| 2004/0145852 A1* | 7/2004 | Kraz | H01T 23/00 361/225 |
| 2005/0031503 A1 | 2/2005 | Fox et al. | |
| 2005/0286201 A1* | 12/2005 | Jacobs | H01T 23/00 361/220 |
| 2009/0053989 A1 | 2/2009 | Lunde et al. | |

FOREIGN PATENT DOCUMENTS

| | | |
|---|---|---|
| JP | 2011124006 | 6/2011 |
| WO | WO2006/050086 | 5/2006 |

\* cited by examiner

IONIZER MONITORING SYSTEM AND ION SENSOR

CROSS-REFERENCE TO RELATED APPLICATIONS

This application is filed under 35 U.S.C. § 120 as a continuation-in-part of U.S. patent application Ser. No. 15/954,041, filed Apr. 16, 2018, which application is hereby incorporated by reference in its entirety.

FIELD

The present disclosure relates to an ionizer system, and, more particularly, to an ionizer system having a controller that monitors and regulates the ions in the air using a sensor and at least one ionizer.

BACKGROUND

Air ionizers are often used in places where work is done involving static-electricity-sensitive electronic components, to eliminate the build-up of static charges on non-conductors as well as static cling. As those elements are very sensitive to electricity, they cannot be grounded because the rapid discharge will destroy them as well. Usually, the work is done over a special dissipative table mat, which allows a very slow discharge, and under the air gush of an ionizer. For example, clean rooms having expensive and sensitive machines therein often require ionizers to neutralize static charge therein. In another example, ionizers may be used in environments containing explosive gases or powders.

Historically, effectiveness of anti-static ionizers has been verified by the use of a charged plate monitor (CPM). The monitor consists of a metal plate exposed to the air, which is charged to a substantial voltage (typically on the order of +1000V or −1000V). A non-contact, or other very high impedance, voltmeter measures the voltage on the plate as it discharges. The ions of opposite charge in the air are attracted to the charged plate, and when they come in contact with the plate, the charge is neutralized. The discharge time of the plate is used as a measurement of the effectiveness of the ionization system. Some of the disadvantages of this system include: lack of continuous monitoring; potential safety hazards of the exposed high-voltage plate; the depletion of the ions near the charged plate, thereby reducing the effectiveness of the ionization protection when a test is in process; and, relatively large plate area. Additionally, CPMs typically can only sense positive ions or negative ions, not both, at a time. Or, two separate CPMs would be utilized, one detecting positive ions and the other detecting negative ions, each requiring its own power source.

Thus, there has been a long-felt need for a sensor that overcomes the limitations of traditional CPMs by performing continuous measurement of the ion current, rather than making an indirect measurement on the voltage of a plate as it discharges due to the ion current. Additionally, there has been a long-felt need for an ionization monitoring system that communicates with the sensor and one or more ionizers, to automatically adjust ion production to maintain ion balance in the air.

SUMMARY

According to aspects illustrated herein, there is provided a sensor for sensing ions, comprising a circuit board assembly, and a core assembly connected to the circuit board assembly, the core including a first electrical conductor and a second electrical conductor.

According to aspects illustrated herein, there is provided a sensor for sensing ions, comprising a circuit board assembly, a core assembly connected to the circuit board assembly, the core including a first rod, a second rod, a first plate connected to the first rod, and a second plate connected to the second rod, and a cage at least partially surrounding the core assembly and electrically connected to the circuit board assembly.

According to aspects illustrated herein, there is provided a sensor for sensing ions, comprising a circuit board assembly, a core, a cage at least partially surrounding the core, a first wire wrapped around the core and connected to the circuit board assembly, a second wire wrapped around the core and connected to the circuit board assembly, and a third wire connecting the cage to the circuit board assembly.

According to aspects illustrated herein, there is provided an ionizer system, comprising a controller, at least one sensor connected to the controller, the at least one sensor including a first circuit board assembly, a core, a cage at least partially surrounding the core, a first wire wrapped around the core and connected to the first circuit board assembly, a second wire wrapped around the core and connected to the first circuit board assembly, and a third wire connecting the cage to the first circuit board assembly, and at least one ionizer connected to the controller.

According to aspects illustrated herein, there is provided a method of monitoring an ionizing system, the method comprising receiving a first set of data from at least one sensor of an unacceptable rate/quantity of ions, making a first determination, based on the first set of data, whether more ions or fewer ions are needed, sending a first signal, based on the first determination, to at least one ionizer to produce more ions or fewer ions, sending a first communication about the first determination and the first signal to a remote computing device, receiving a second set of data from the at least one sensor of an acceptable rate/quantity of ions, making a second determination, based on the second set of data, that no more ions or fewer ions are needed, sending a second signal, based on the second determination, to the at least one ionizer to produce the same rate of ions, sending a second communication about the second determination and the second signal to the remote computing device, receiving a third set of data from the at least one sensor of an ion imbalance, making a third determination, based on the third set of data, whether positive ions or negative ions are needed, sending a third signal, based on the third determination, to at least one ionizer to produce the positive ions or negative ions, sending a third communication about the third determination and the third signal to a remote computing device, receiving a fourth set of data from the at least one sensor of an ion balance, making a fourth determination, based on the fourth set of data, that no positive ions or negative ions are needed, sending a fourth signal, based on the fourth determination, to the at least one ionizer to stop producing positive and negative ions, and sending a fourth communication about the fourth determination and the fourth signal to the remote computing device.

According to aspects illustrated herein, there is provided a method of monitoring an ionizing system, the method comprising receiving a first set of data from at least one sensor of an ion imbalance, making a first determination, based on the first set of data, whether positive ions or negative ions are needed, sending a first signal, based on the first determination, to at least one ionizer to produce the positive ions or negative ions, sending a first communication about the first determination and the first signal to a remote computing device, receiving a second set of data from the at least one sensor of an ion balance, making a second determination, based on the second set of data, that no positive ions or negative ions are needed, sending a second signal, based on the second determination, to the at least one ionizer to stop producing positive and negative ions, and sending a second communication about the second determination and the second signal to the remote computing device.

According to aspects illustrated herein, there is provided a method of monitoring an ionizing system, the method comprising receiving a first set of data from at least one sensor of an unacceptable rate/quantity of ions, making a first determination, based on the first set of data, whether more ions or fewer ions are needed, sending a first signal, based on the first determination, to at least one ionizer to produce more ions or fewer ions, sending a first communication about the first determination and the first signal to a remote computing device, receiving a second set of data from the at least one sensor of an acceptable rate/quantity of ions, making a second determination, based on the second set of data, that no more ions or fewer ions are needed, sending a second signal, based on the second determination, to the at least one ionizer to produce the same rate of ions, and sending a second communication about the second determination and the second signal to the remote computing device.

The sensor of the instant invention overcomes the limitations of traditional CPMs by performing continuous measurement of the ion current, rather than making an indirect measurement on the voltage of a plate as it discharges due to the ion current. The measurement of current is enabled by a very low-leakage, high-impedance amplifier, configured as a "transimpedance amplifier." This configuration converts current to voltage and is often used to detect small currents in photodiodes, such as those detecting optical data at the end of a long fiber-optic cable. This configuration enables measurements on the order of picoamps, an extremely low current level. For comparison, one Amp of current is equivalent to $6.25 \times 10^{18}$ electrons per second, similar to the amount of current required to charge a cell phone. One picoamp is only 6,250,000 electrons per second, and a measurement of one picoamp of current represents approximately 6 million ions colliding with the sensor element per second.

In some embodiments, the sensor itself is composed of two interleaved wire helices wrapped around a common core element, surrounded by a metal (conductive) shield with openings to allow airflow. The shield protects the sensor helices from electric fields which would otherwise affect the measurements and thus the readings. The conductive metal shield is connected to the electrical ground plane of the sensor circuit boards. The circuit boards are also enclosed with conductive metal shielding to prevent interference, essentially forming a Faraday cage around the sensitive circuitry. In some embodiments, the common core element comprises parallel stripes along the length thereof with adjacent stripes having alternating polarity. In some embodiments, the common core element comprises a plurality of straight parallel wires. In some embodiments, the common core element comprises a plurality of helically arranged wires.

The two helices are charged to voltages of approximately +35V and −35V, respectively, though the precise voltage may be adjusted for various reasons, including adjusting sensitivity, calibration, or to accommodate specific requirements of the customer. The helix with a positive charge, when impacted by negative ions, gains electrons, and the transimpedance amplifier converts this ion current into a voltage. Similarly, the negatively charged helix, when impacted by positive ions, loses electrons, and the transimpedance amplifier converts this current to a voltage as well. These voltages are filtered, amplified, conditioned, and ultimately digitized by an Analog to Digital Converter (ADC). The resulting digitized values are processed through proprietary algorithms to produce a result equivalent to the discharge time measured by a CPM. The measurements are also processed through a different proprietary algorithm to determine the Direct Current (DC) balance of the ionizing system. If an uncharged CPM is placed in an ionizing stream, ideally, the plate would remain at zero volts with respect to ground, but many ionizers produce a slight imbalance in their ion streams, resulting in the CPM receiving a small positive or negative charge. The sensor of the instant invention can also measure this DC offset, essentially by comparing the results of the positive and negative helix currents.

The digitized data sets are converted to a serial message format and transmitted via RS-485 (or another communication physical layer) to a controller. The level of ionization and the DC balance will be used to send control messages from the controller to an ionizer, adjusting it to ensure optimal protection against electrical charge buildup. The controller stores some data short-term and feeds the information via a network protocol (e.g., via Wi-Fi, Ethernet, or any other suitable method) to a data aggregator, which handles long-term storage of the measurements (e.g., computing device). A user interface, initially a web browser in a computer, tablet, or mobile device, provides measurements, graphs, and alerts to the user. Cloud connectivity is also an option, enabling enterprise-wide monitoring. Connectivity to other process automation software and hardware will allow improved process control and product manufacturing monitoring, enabling traceability of a particular item back to each manufacturing step, and a log of how effective the anti-static measures were.

The controller provides for automatic, real-time adjustment of ionizer DC balance, data logging of measured ionizer performance, and a remote, distributed system allowing for a Wi-Fi/Wireless/Wired network, local control, central data aggregation, cloud connectivity, user notification/email/paging/display, Web Interface, and mobile app access and control. The controller further provides an extensible system to allow addition of new sensors, indicators, ionizers, and other components in the future.

These and other objects, features, and advantages of the present disclosure will become readily apparent upon a review of the following detailed description of the disclosure, in view of the drawings and appended claims.

BRIEF DESCRIPTION OF THE DRAWINGS

Various embodiments are disclosed, by way of example only, with reference to the accompanying schematic drawings in which corresponding reference symbols indicate corresponding parts, in which.

DETAILED DESCRIPTION

At the outset, it should be appreciated that like drawing numbers on different drawing views identify identical, or functionally similar, structural elements. It is to be understood that the claims are not limited to the disclosed aspects.

Furthermore, it is understood that this disclosure is not limited to the particular methodology, materials and modifications described and as such may, of course, vary. It is also understood that the terminology used herein is for the purpose of describing particular aspects only, and is not intended to limit the scope of the claims.

Unless defined otherwise, all technical and scientific terms used herein have the same meaning as commonly understood to one of ordinary skill in the art to which this disclosure pertains. It should be understood that any methods, devices or materials similar or equivalent to those described herein can be used in the practice or testing of the example embodiments.

It should be appreciated that the term "substantially" is synonymous with terms such as "nearly," "very nearly," "about," "approximately," "around," "bordering on," "close to," "essentially," "in the neighborhood of," "in the vicinity of," etc., and such terms may be used interchangeably as appearing in the specification and claims. It should be appreciated that the term "proximate" is synonymous with terms such as "nearby," "close," "adjacent," "neighboring," "immediate," "adjoining," etc., and such terms may be used interchangeably as appearing in the specification and claims. The term "approximately" is intended to mean values within ten percent of the specified value.

Figure 1:
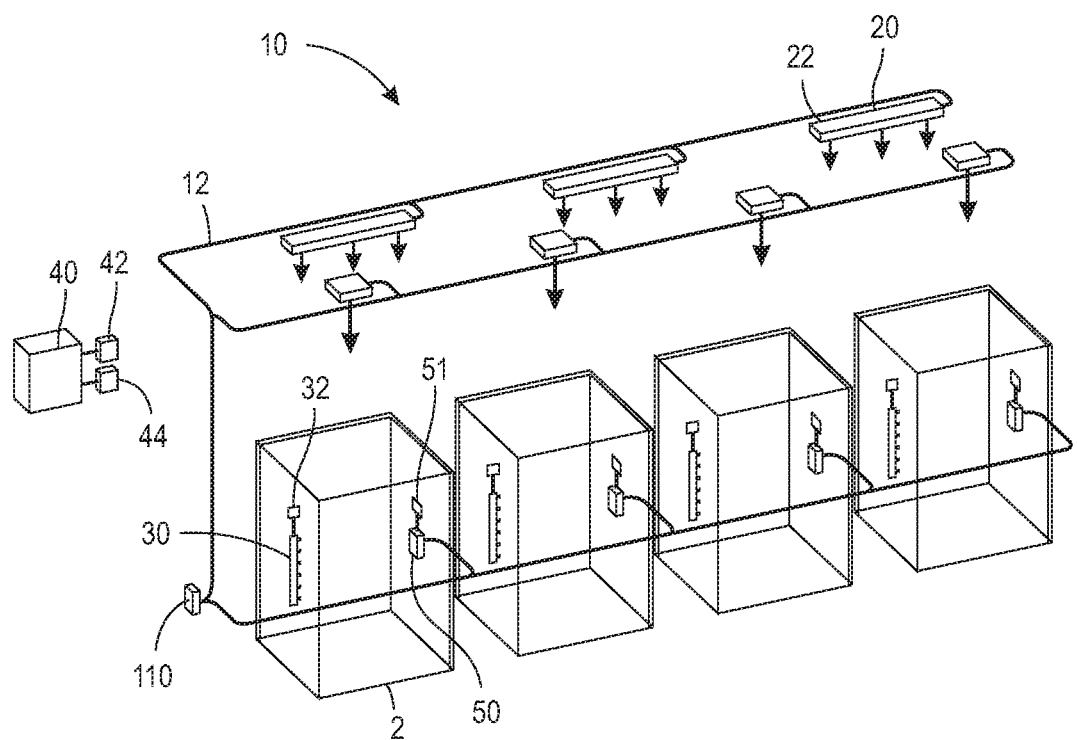
FIG. 1 is a front perspective view of an ionizer system.

Adverting now to the figures, FIG. 1 is a front perspective view of ionizer system 10. Ionizer system generally comprises sensor 50, controller 110, and at least one ionizer. In some embodiments, ionizer system 10 comprises whole room ionizer 20, individual ionizer 30, sensor 50, and controller 110. Whole room ionizer 20, individual ionizer 30, and sensor 50 are connected to controller 110 via electrical conduit 12. Whole room ionizer 20, individual ionizer 30, and sensor 50 are also provided power through electrical conduit 12. However, it should be appreciated that whole room ionizer 20, individual ionizer 30, and sensor 50 may be connected to controller 110 via wireless communication, for example, Wi-Fi, Bluetooth technology, ZigBee, Infrared (IR), Radio, or any other suitable wireless communication method. In a wireless embodiment, whole room ionizer 20, individual ionizer 30, and sensor 50 would each have a suitable power source, for example, AC mains or battery. Controller 110 is capable of wirelessly communicating with remote computing device 40. Computing device 40 includes receiver 42 for receiving information from controller 110 and transmitter 44 for sending information to controller 110. Computing device 40 may also have a digital user interface.

Whole room ionizer 20 is a device that uses high voltage to ionize (electrically charge) air molecules. Whole room ionizer 20 is capable of generating negative ions, or anions, which are particles with one or more extra electron, conferring a net negative charge to the particle. Whole room ionizer 20 is also capable of generating positive ions, or cations, which are ions missing one or more electrons, resulting in a net positive charge. Whole room ionizer 20 may comprise a fan physically built therein. As ions are generated, the fan distributes the ions throughout the room or space. Whole room ionizer 20 is connected to controller 110 via electrical conduit 12. Whole room ionizer 20 is generally in communication with sensor 50. Specifically, whole room ionizer 20 receives instructions from controller 110 to distribute more negative ions and/or positive ions throughout the space or room. In some embodiments, whole room ionizer 20 comprises receiver 22 and receives instructions from controller 110 via wireless transmission, without the need for physical electrical connection therebetween. It should be appreciated that ionizer system 10 may have any number of whole room ionizers to provide suitable ionization for the environment. For example, ionizer system 10 may have one or more whole room ionizers arranged thereon.

Individual ionizer 30 is a device that uses high voltage to ionize (electrically charge) air molecules. Individual ionizer 30 is capable of generating negative ions, or anions, which are particles with one or more extra electron, conferring a net negative charge to the particle. Individual ionizer 30 is also capable of generating positive ions, or cations, which are ions missing one or more electrons, resulting in a net positive charge. Individual ionizer 30 is preferably arranged on, or close in proximity to, machine 2. Individual ionizer 30 provides a higher concentration of ions directly around machine 2, whereas whole room ionizer 20 distributes ions generally to the entire space or room. Individual ionizer 30 may use compressed air to distribute ions, rather than a fan as in whole room ionizer 20. For example, as ions are generated, the compressed air distributes the ions directly around machine 2. In some embodiments, individual ionizer 30 is connected to a compressor, which provides the compressed air. It should be appreciated that individual ionizer 30 may use a fan to distribute ions, and that whole room ionizer 20 may use compressed air to distribute ions. Individual ionizer 30 is connected to controller 110 via electrical conduit 12. Individual ionizer 30 is generally in communication with sensor 50. Specifically, individual ionizer 30 receives instructions from controller 110 to distribute more negative ions and/or positive ions throughout to and around machine 2. In some embodiments, individual ionizer 30 comprises receiver 32 and receives instructions from controller 110 via wireless transmission, without the need for physical electrical connection therebetween. It should be appreciated that ionizer system 10 may have any number of individual ionizers to provide suitable ionization for the environment. For example, every machine may have one or more individual ionizers arranged thereon.

Figure 2:
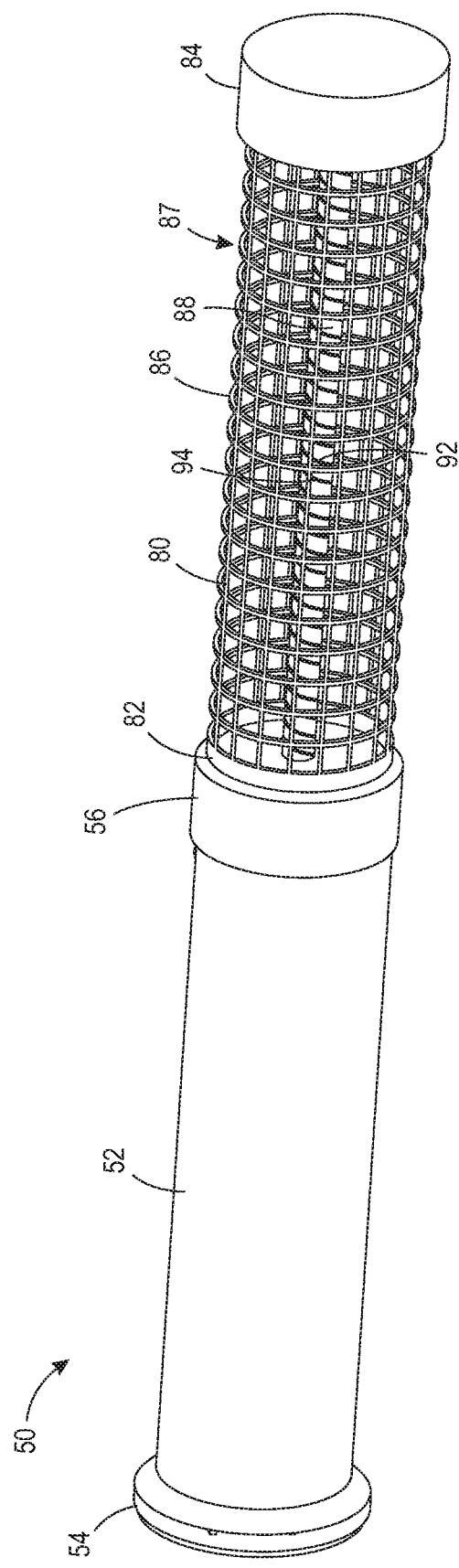
FIG. 2 is a top perspective view of a sensor, as shown in FIG. 1.
Figure 3:
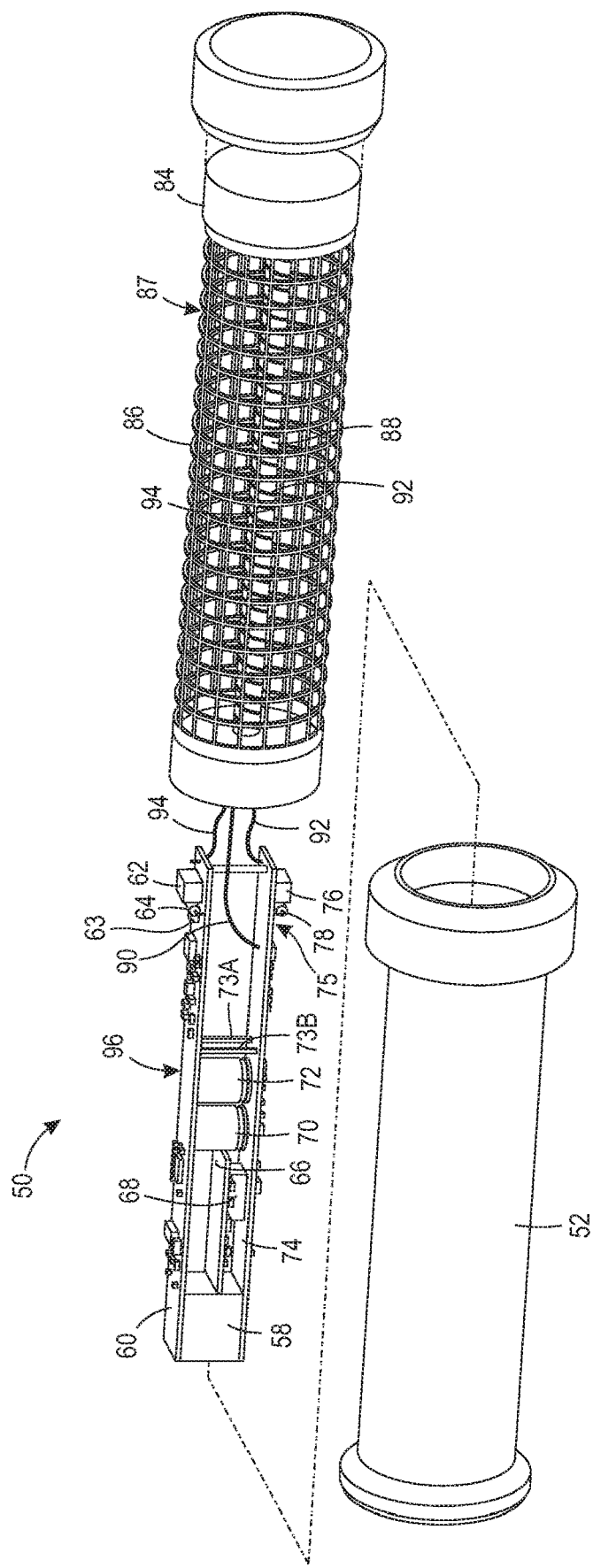
FIG. 3 is an exploded perspective view of the sensor shown in FIG. 2.
Figure 4:
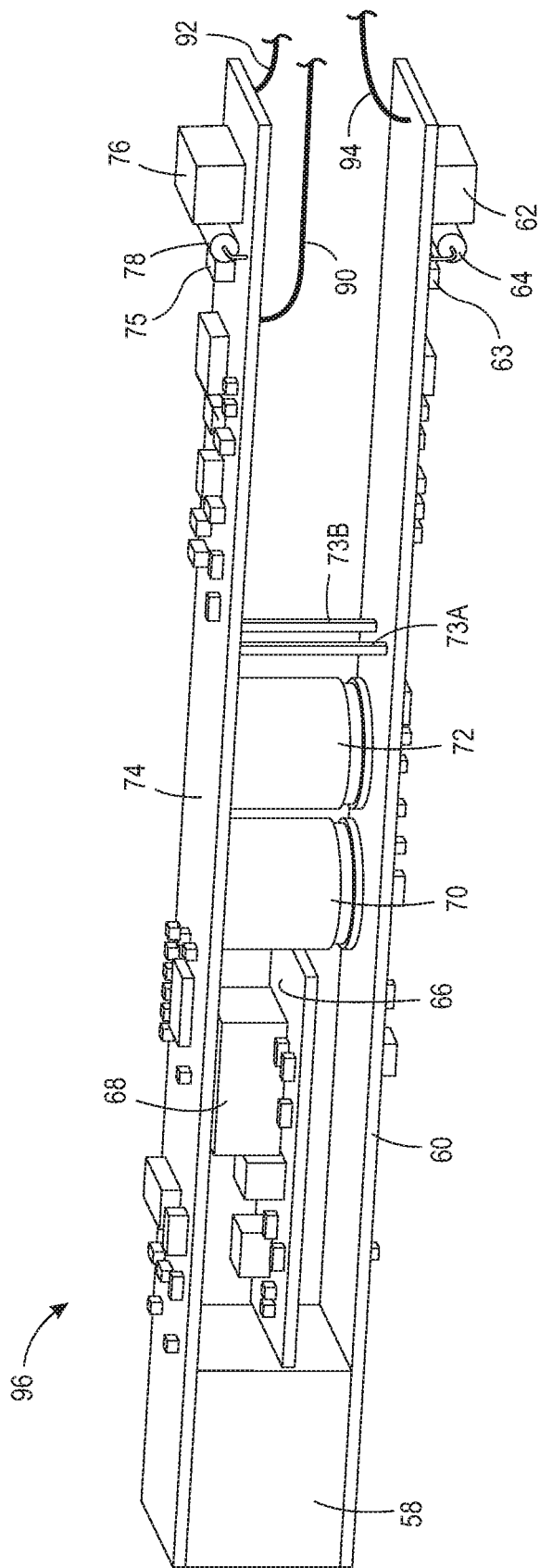
FIG. 4 is a perspective view of a circuit board assembly as shown in FIG. 3.

FIG. 2 is a top perspective view of sensor 50. FIG. 3 is an exploded view of sensor 50. FIG. 4 is a perspective view of circuit board assembly 96. Sensor 50 generally comprises housing 52, ion sensor 80, and circuit board assembly 96. Sensor 50 compares positive and negative ions in the space or room and sends that information to controller 110. The following description should be read in view of FIGS. 2-4.

Housing 52 is generally cylindrical and comprises end 54 and end 56. Housing 52 is preferably a conductive metal shielding that at least partially forms a Faraday shield around circuit board assembly 96, which is housed therein. A Faraday shield or Faraday cage (as discussed below) is an enclosure used to block electromagnetic fields. A Faraday shield may be formed by a continuous covering of conductive material or in the case of a Faraday cage, by a mesh of such materials. As such, housing 52 prevents interference with the sensitive circuitry of circuit board assembly 96. In some embodiments, housing 52 comprises stainless steel. In some embodiments, housing 52 comprises a plastic shell that is internally coated with a metal. End 54 comprises port 58. Sensor 50 is connected to controller 110 through port 58 via electrical conduit 12. In some embodiments, port 58 is a RJ 45 connector. However, it should be appreciated that port 58 may comprise any connector suitable for providing an interface between sensor 50 and controller 110. In some embodiments, sensor 50 communicates with controller 110 via transmitter 51.

Ion sensor 80 extends from housing 52. Ion sensor 80 comprises cage 86 and core 88, both extending between end 82, connected to end 56, and end 84. In some embodiments, ion sensor 80 does not comprise cage 86. Ends 82 and 84 may comprise a conductive material, or may comprise plastic or other non-conductive material coated or wrapped in a conductive material such as copper foil. The material of ends 82 and 84 is such that it aids in creating a Faraday cage as discussed further below. Core 88 is a nonconductive core including two interleaved wire helices wrapped therearound. As shown in the figures, wires 92 and 94 are alternatingly wrapped around core 88, which are connected to circuit board assembly 96. Specifically, wire 92 is connected to circuit board 74 via any suitable method, for example, soldering. Wire 94 is connected to circuit board 60 via any suitable method, for example, soldering. One of wires 92 and 94 is charged to a voltage of approximately +35V and the other of wires 92 and 94 is charged to a voltage of approximately −35V. However, it should be appreciated that the precise voltage may be adjusted for various reasons, including adjusting sensitivity, calibration, or to accommodate specific requirements of the user. In some embodiments, wire 92 comprises a positive charge and, when impacted by negative ions, gains electrons. Wire 92 is connected to circuit board 74 which comprises a transimpedance amplifier that converts this ion current into a voltage. Similarly, wire 94 comprises a negative charge and, when impacted by positive ions, loses electrons. Wire 94 is connected to circuit board 60 which comprises a transimpedance amplifier that converts this current to a voltage. It should be appreciated that in some embodiments, wire 92 may comprise a negative charge and wire 94 may comprise a positive charge. These voltages are filtered, amplified, conditioned, and ultimately digitized by an ADC. The resulting digitized values are processed through proprietary algorithms to produce a result equivalent to the discharge time measured by a CPM. The measurements are also processed through a different proprietary algorithm to determine the DC balance of the ionizing system. If an uncharged CPM is placed in an ionizing stream, ideally, the plate would remain at zero volts with respect to ground, but many ionizers produce a slight imbalance in their ion streams, resulting in the charged plate monitor receiving a small positive or negative charge. This sensor technology can also measure this DC offset, essentially by comparing the results of the positive and negative helix currents. In some embodiments, wires 92 and 94 are uninsulated, low corrosion, gold plated wires. The double-helix sensor design functions to provide real-time, direct measurement of ion current, and low noise/leakage.

Cage 86 is a metal (conductive) shield having openings 87 to allow airflow to core 88. Cage 86 forms a Faraday cage which protects wires 92 and 94 from electric fields that would otherwise affect the readings. Cage 86 is connected to the electrical ground plane of the sensor circuit boards, for example, an electrical ground plane (not shown) within circuit board 74, via wire 90. It should be appreciated that, cage 86 may be connected to an electrical ground plane located on circuit board 60 via wire 90. Furthermore, the electrical ground plane in circuit board 74 and the electrical ground plane in circuit board 60 are connected via one or more conductive pins, shown as pins 73A and 73B. Pins 73A and 73B extend from circuit board 60 to circuit board 74 to electrically connect the ground planes arranged in circuit board 60 and circuit board 74. The ground planes in circuit boards 60 and 74 help reduce the influence of external noise sources from interrupting the circuitry of circuit board assembly 96. The ground planes of the circuit boards keep sensitive analog circuits operating at low noise capability. It should be appreciated that any number of pins suitable for connecting the ground planes to reduce the external noise affecting the circuitry may be used. In some embodiments, cage 86 is arranged as a mesh shield that attenuates external electromagnetic waves before they reach the double helix formed by wires 92 and 94, yet allows ions to flow therethrough. Openings 87 may comprise a square, hexagonal, circular, or irregular polygon geometry, or any other suitable geometry. In some embodiments, cage 86 is left ungrounded and is used to measure the offset voltage of the ion stream. In some embodiments, ion sensor 80 does not comprise cage 86, but rather only core assembly 88.

Circuit board assembly 96 generally comprises circuit board 60, circuit board 74, and circuit board 66, which are all connected to port 58. Circuit boards 60, 74, and 66 may be printed circuit boards (PCBs). Power inductor 68 is arranged between circuit board 66 and circuit board 74. However, power inductor 68 may be arranged at any suitable location relative to circuit boards 66 and 74. Circuit board 66 and power inductor 68 are arranged to regulate the power supplied to sensor 50. Circuit board 60 comprises inter alia, control relay 62, gain-control resistor 64, filter capacitor 63, and a transimpedance amplifier, and is connected to wire 94. Circuit board 60 is arranged to convert current in wire 94 to a voltage, and subsequently filter, amplify, condition, and digitize that voltage. Similarly, circuit board 74 comprises inter alia, control relay 76, gain-control resistor 78, filter capacitor 75, and a transimpedance amplifier, and is connected to wire 92. Circuit board 74 is arranged to convert current in wire 92 to a voltage, and subsequently filter, amplify, condition, and digitize that voltage. The digitized sets of data created by circuit boards 60 and/or 74 are then converted to a serial message format and transmitted via RS-485 (or another communication means) to controller 110. The level of DC balance determined by sensor 50 will be used by controller 110 to send information to an ionizer, adjusting it to ensure optimal protection against electrical charge buildup, as will be discussed in greater detail below.

Figure 5:
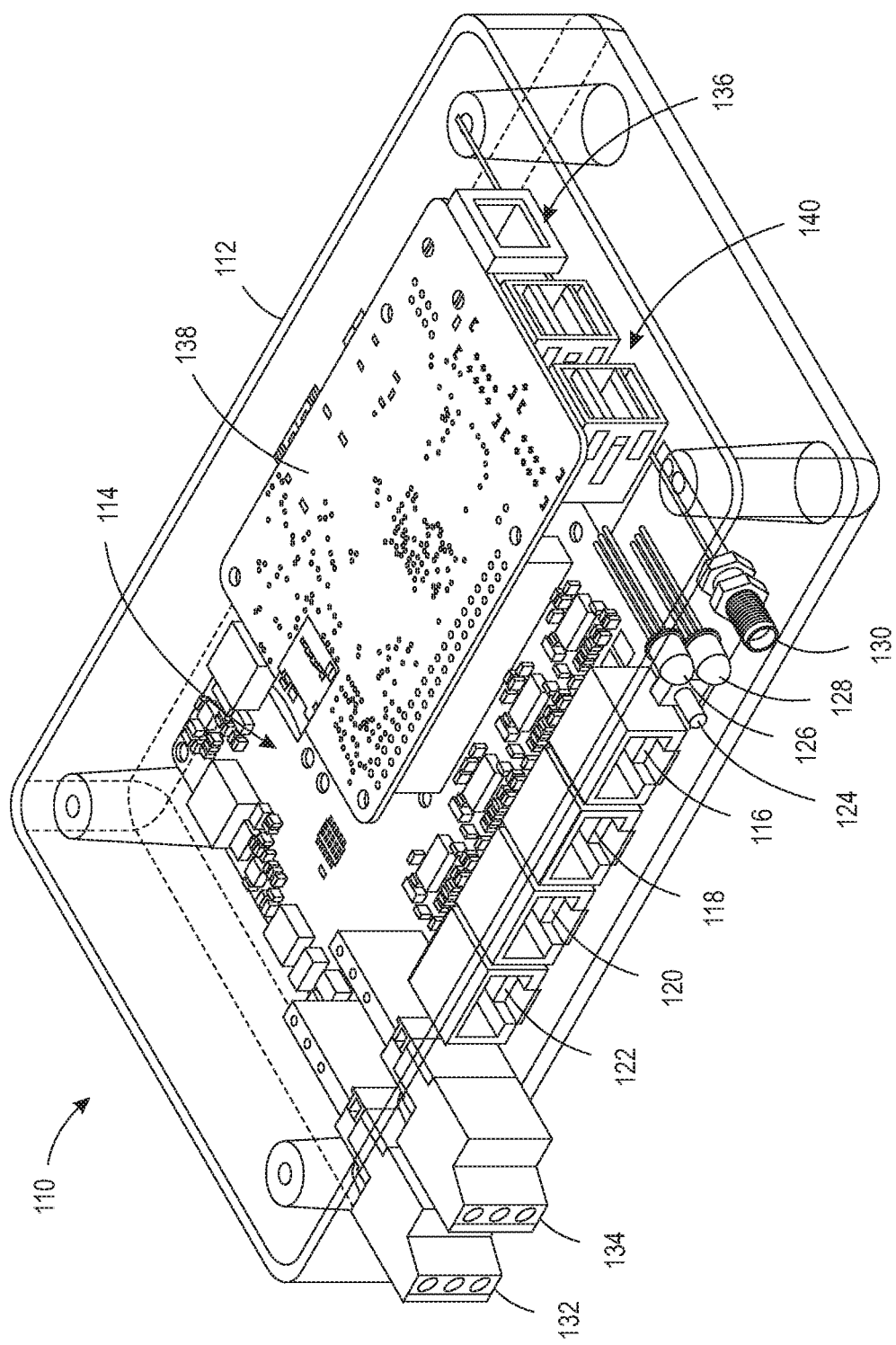
FIG. 5 is a perspective view of a controller, as shown in FIG. 1.
Figure 6:
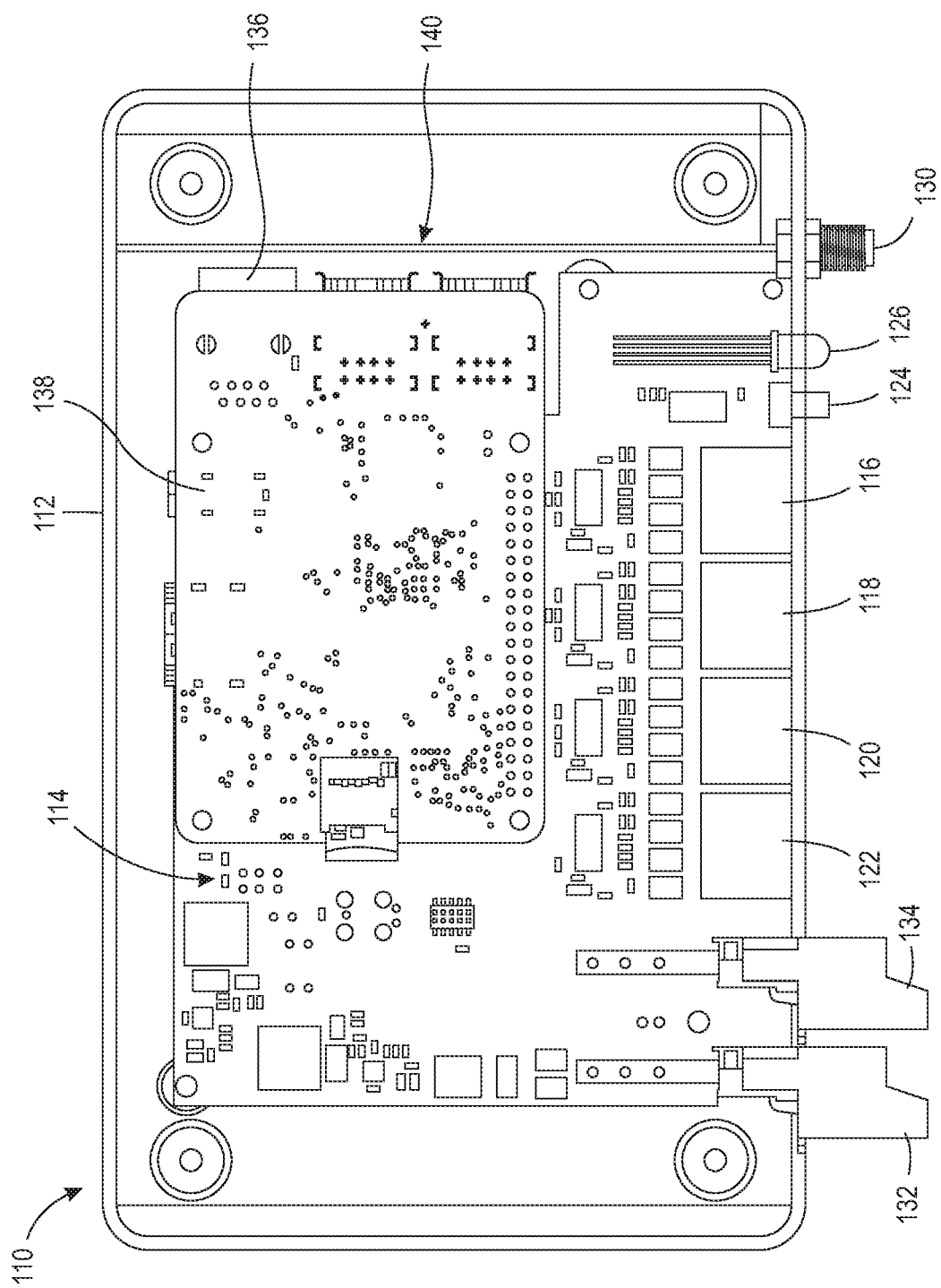
FIG. 6 is a top elevational view of the controller shown in FIG. 5.

FIG. 5 is a perspective view of controller 110, with a top portion of housing 112 removed for viewing purposes. FIG.

Figure 7:
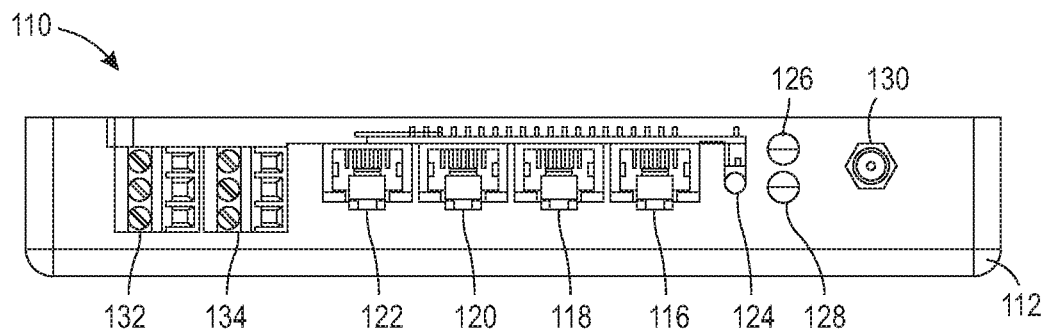
FIG. 7 is a front elevational view of the controller shown in FIG. 5.
Figure 8:
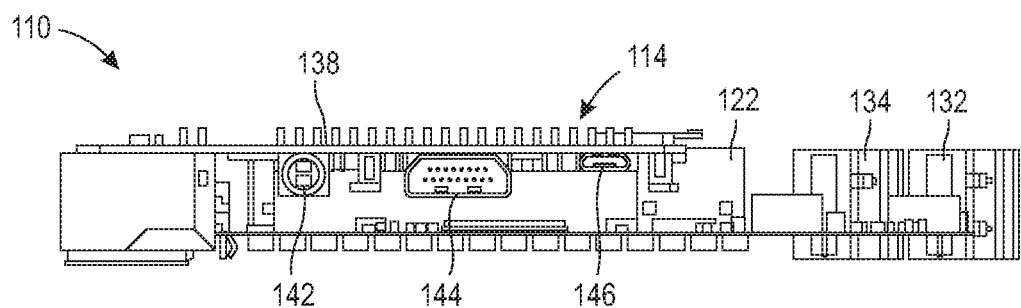
FIG. 8 is a rear elevational view of the controller shown in FIG. 5.

6 is a top elevational view of controller 110. FIG. 7 is a front elevational view of controller 110. FIG. 8 is a rear elevational view of controller 110 with housing 112 completely removed for viewing purposes. The following description should be read in view of FIGS. 5-8.

Controller 110 generally comprises housing 112 which protectively encloses circuit board 114 and data aggregator 138. Housing 112 comprises bottom portion 112A and top portion 112B (not shown). In some embodiments, data aggregator 138 comprises a central processing unit (CPU).

Circuit board 114 comprises event detector port 116, ionizer port 118, sensor port 120, optional port 122, mode button 124, indicator lights 126 and 128, antenna port 130, power port 132, and optional communication or trigger port 134. Controller 110 is supplied power via power port 132. Mode button 124 allows a user to interact with controller 110. It should be appreciated that ports 116, 118, 120, and 122 are equivalent and interchangeable, and they also provide power to the peripherals. The peripherals announce to controller 110 what they are when they are plugged in. For example, if sensor 50 is plugged into port 118, the peripheral tells controller 110 to turn port 118 into a sensor port. The same detection means are included into each of the ports. It should be appreciated that controller 110 may have any suitable number of ports, and the instant invention is not limited to the number of ports illustrated in the figures.

Event detector port 116 is arranged to send a signal or signals to a remote location indicating that ionizer system 10 is not operating normally. If an error has occurred with controller 110, sensor 50, whole room ionizer 20, or individual ionizer 30, controller 110 sends a signal to indicate such (e.g., if an ionizer or sensor has been damaged). Controller 110 may also send a signal via event detector port 116 to a remote location to indicate the ionizer system 10 is operating normally. Similarly, indicator lights 126 and 128 are arranged for a visual indication of system status. In some embodiments, indicator light 126 is red and indicator light 128 is green. When ionizer system 10 is operating normally, indicator light 128 is on and indicator light 126 is off. When an error has occurred in ionizer system 10, as discussed above, indicator light 126 is on and indicator light 128 is off. Indicator lights 126 and 128 are preferably light emitting diodes (LEDs); however, it should be appreciated that indicator lights 126 and 128 may be any other suitable light source and any colors suitable for indicating the status of ionizer system 10. In some embodiments, indicator lights 126 and 128 are red/green/blue LEDs and can indicate any color of the visible spectrum. In some embodiments, controller 110 comprises a speaker and indicates that an error has occurred in ionizing system 10 via an alarm or other suitable noise (e.g., a siren). In some embodiments, the colors indicated by indicator lights 126 and 128 could change back and forth depending on ion balance. In some embodiments, the colors indicated by indicator lights 126 and 128 could show ion strength in a thermometer-style display.

Ionizer port 118 is arranged to physically connect one or more ionizers to controller 110. For example, whole room ionizer 20 and/or individual ionizer 30 are connected to controller 110 via ionizer port 118. It should be appreciated that controller 110 may have one or more ionizer ports, and that the embodiment shown is not limited to only one ionizer port. In some embodiments, controller 110 comprises a separate ionizer port for each ionizer in ionizer system 10. Controller 110 may control all of the ionizers in ionizer system 10 together. For example, if controller 110 receives a signal from sensor 50 that ionizer system 10 needs more positive ions, controller 110 sends a signal to all of the ionizers to produce more positive ions. Controller 110 may control each of the ionizers in ionizer system 10 separately. For example, if controller 110 receives a signal from sensor 50 that machine 2 needs more positive ions, controller 110 sends a signal to only the individual ionizer 30, and not to whole room ionizer 20, to produce more positive ions.

Sensor port 120 is arranged to physically connect one or more sensors to controller 110. For example, sensor 50 is connected to controller 110 via sensor port 120. It should be appreciated that controller 110 may have one or more sensor ports, and that the embodiment shown is not limited to only one sensor port. In some embodiments, controller 110 comprises a separate sensor port for each sensor in ionizer system 10. Controller 110 may receive information from all of the sensors in ionizer system 10 together. For example, if controller 110 receives a signal from one sensor that ionizer system 10 needs more positive ions, controller 110 sends a signal to all of the ionizers to produce more positive ions. Controller 110 may receive information from each of the sensors in ionizer system 10 individually and locationally. For example, if controller 110 receives a signal from sensor 50 that machine 2 needs more positive ions, controller 110 sends a signal to only the individual ionizer 30, and not to whole room ionizer 20, to produce more positive ions. In some embodiments, sensor port 120 comprises a built in boot loader for programming controller 110, specifically circuit board 114.

Antenna port 130 is arranged to physically connect the transducer in controller 110 to an external transmitter or antenna, or an external transmitter having an antenna, either directly or through an extension cable. Specifically, antenna port 130 is arranged to connect to a transmission device or antenna, or a transmission device having an antenna, to transmit information wirelessly to receiver 42 of computing device 40. In some embodiments, a transmission device may be built directly into controller 110 as will be discussed below. However, antenna port 130 allows for connection to a transmission device that is, for example, outside of the Faraday cage in which controller 110 is located.

Aggregator 138 comprises programming port 136, Universal Serial Bus (USB) ports 140, audio/composite video port 142, High-Definition Multimedia Interface (HDMI) port 144, and micro Universal Serial Bus (USB) port 146. Aggregator 138 is arranged as a hardware device engineered to extract real-time intersection and traffic cabinet data from interconnected or non-interconnected intersections. In some embodiments, aggregator 138 is a subassembly of controller 110 having a CPU and used as an optional controller.

Controller 110 stores some data short-term (i.e., via aggregator 138) and feeds the information via a network protocol (e.g., Wi-Fi, Ethernet, or any other suitable means) to computing device 40, which handles long-term storage of the measurements. A user interface, initially a web browser in a computer, tablet, or mobile device, provides measurements, graphs, and alerts to the user. Cloud connectivity is also an option, enabling enterprise-wide monitoring. Connectivity to other process automation software and hardware will allow improved process control and product manufacturing monitoring, enabling traceability of a particular item back to each manufacturing step, and a log of how effective the anti-static measures were.

Controller 110 receives information from sensor 50, for example, that there is an imbalance in positive and negative ions. Controller 110 then sends a signal to whole room ionizer 20 and/or individual ionizer 30 to produce either positive or negative ions, whichever are needed. Sensor 50 then sends a signal to controller 110 when there is a balance in positive and negative ions. Controller 110 then sends a signal to whole room ionizer 20 and individual ionizer 30 to stop producing ions or maintain the present ratio. Controller 110 sends information to computing device 40 which is arranged to log data. For example, data may collected regarding the length of time the ionizers run in order to balance the ions in the space or room. If the ionizers need to run for 45 minutes while producing negative ions, but only need to run for 10 minutes while producing positive ions, this may be an indication that the ionizers are not producing negative ions as efficiently as they should be. Additionally or alternatively, this may be an indication that something in the space or room (e.g., a machine) is causing the significant imbalance of positive ions to negative ions, which is resulting in the need for significantly more negative ions. The real-time monitoring and data logging capabilities of ionizer system 10, specifically through the use of sensor 50, allows the efficiencies of the ionizers to be determined quickly and effectively, and allows deficiencies in machines or abnormalities in the environment to be detected.

Figure 9:
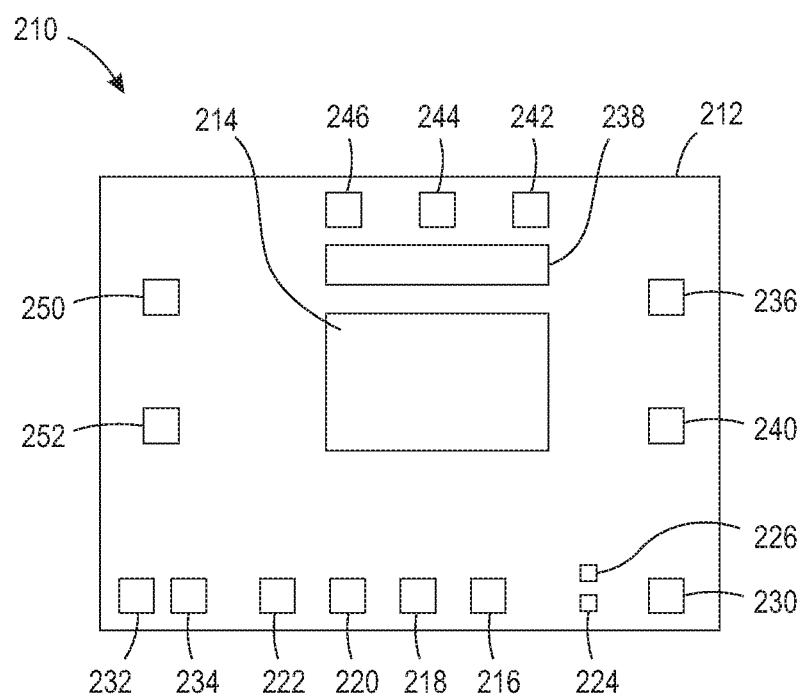
FIG. 9 is a schematic view of a controller.

FIG. 9 is a schematic view of controller 210. Controller 210 generally comprises housing 212 which protectively encloses circuit board 214, data aggregator 238, receiver 250, and transmitter 252. Housing 212 comprises bottom portion 212A and top portion 212B (not shown). Receiver 250 receives information wirelessly from a remote location, e.g., computing device 40. Receiver 250 allows controller 210 to be programmed wirelessly and remotely. Transmitter 252 allows controller 210 to send information wirelessly to a remote location, e.g., computing device 40. Transmitter 252 may be a replacement for, or additional component to, antenna port 230.

Circuit board 214 comprises event detector port 216, ionizer port 218, sensor port 220, optional port 222, mode button 224, indicator lights 226 and 228, antenna port 230, power port 232, and optional communication or trigger port 234. Controller 210 is supplied power via power port 232. Mode button 224 allows a user to interact with controller 210. It should be appreciated that the various ports are interchangeable and not dedicated to a specific location. Additionally, the various ports can be rededicated to provide for other uses.

Event detector port 216 is arranged to send a signal or signals to a remote location indicating that ionizer system 10 is not operating normally. If an error has occurred with controller 210, sensor 50, whole room ionizer 20, or individual ionizer 30, controller 210 sends a signal to indicate such (e.g., if an ionizer or sensor has been damaged). Controller 210 may also send a signal via event detector port 216 to a remote location to indicate the ionizer system 10 is operating normally. Similarly, indicator lights 226 and 228 are arranged for a visual indication of system status. In some embodiments, indicator light 226 is red and indicator light 228 is green. When ionizer system 10 is operating normally, indicator light 228 is on and indicator light 226 is off. When an error has occurred in ionizer system 10, as discussed above, indicator light 226 is on and indicator light 228 is off Indicator lights 226 and 228 are preferably light emitting diodes (LEDs); however, it should be appreciated that indicator lights 226 and 228 may be any other suitable light source and any colors suitable for indicating the status of ionizer system 10. In some embodiments, controller 210 comprises a speaker and indicates that an error has occurred in ionizing system 10 via an alarm or other suitable noise.

Ionizer port 218 is arranged to physically connect one or more ionizers to controller 210. For example, whole room ionizer 20 and/or individual ionizer 30 are connected to controller 210 via ionizer port 218. It should be appreciated that controller 210 may have one or more ionizer ports, and that the embodiment shown is not limited to only one ionizer port. In some embodiments, controller 210 comprises a separate ionizer port for each ionizer in ionizer system 10. Controller 210 may control all of the ionizers in ionizer system 10 together. For example, if controller 210 receives a signal from sensor 50 that ionizer system 10 needs more positive ions, controller 210 sends a signal to all of the ionizers to produce more positive ions. Controller 210 may control each of the ionizers in ionizer system 10 separately. For example, if controller 210 receives a signal from sensor 50 that machine 2 needs more positive ions, controller 210 sends a signal to only the individual ionizer 30, and not to whole room ionizer 20, to produce more positive ions.

Sensor port 220 is arranged to physically connect one or more sensors to controller 210. For example, sensor 50 is connected to controller 210 via sensor port 220. It should be appreciated that controller 210 may have one or more sensor ports, and that the embodiment shown is not limited to only one sensor port. In some embodiments, controller 210 comprises a separate sensor port for each sensor in ionizer system 10. Controller 210 may receive information from all of the sensors in ionizer system 10 together. For example, if controller 210 receives a signal from one sensor that ionizer system 10 needs more positive ions, controller 210 sends a signal to all of the ionizers to produce more positive ions. Controller 210 may receive information from each of the sensors in ionizer system 10 individually and locationally. For example, if controller 210 receives a signal from sensor 50 that machine 2 needs more positive ions, controller 210 sends a signal to only the individual ionizer 30, and not to whole room ionizer 20, to produce more positive ions. In some embodiments, sensor port 220 comprises a built in boot loader for programming controller 210, specifically circuit board 214.

Antenna port 230 is arranged to physically connect controller 210 to a transmitter. Specifically, antenna port 230 is arranged to connect to a transmission device to transmit information wirelessly to receiver 42 of computing device 40. In some embodiments, a transmission device may be built directly into controller 210 as will be discussed below. However, antenna port 230 allows for connection to a transmission device that is, for example, outside of the Faraday cage in which controller 210 is located. In some embodiments, receiver 250 and transmitter 252 are both connected to antenna port 230, and antenna port is connected to a transmitter or an antenna, or a transmitter having an antenna, directly or via an extension cable.

Aggregator 238 comprises programming port 236, Universal Serial Bus (USB) ports 240, audio/composite video port 242, High-Definition Multimedia Interface (HDMI) port 244, and micro Universal Serial Bus (USB) port 246. Aggregator 238 is arranged as a hardware device engineered to extract real-time intersection and traffic cabinet data from interconnected or non-interconnected intersections.

Controller 210 stores some data short-term (i.e., via aggregator 238) and feeds the information via a network protocol (e.g., Wi-Fi, Ethernet, or any other suitable means) to computing device 40, which handles long-term storage of the measurements. A user interface, initially a web browser in a computer, tablet, or mobile device, provides measurements, graphs, and alerts to the user. Cloud connectivity is also an option, enabling enterprise-wide monitoring. Connectivity to other process automation software and hardware will allow improved process control and product manufacturing monitoring, enabling traceability of a particular item back to each manufacturing step, and a log of how effective the anti-static measures were.

Controller 210 receives information from sensor 50, for example, that there is an imbalance in positive and negative ions. Controller 210 then sends a signal to whole room ionizer 20 and/or individual ionizer 30 to produce either positive or negative ions, whichever are needed. Sensor 50 then sends a signal to controller 210 when there is a balance in positive and negative ions. Controller 210 then sends a signal to whole room ionizer 20 and individual ionizer 30 to stop producing ions. Controller 210 sends information to computing device 40 which is arranged to log data. For example, data may collected regarding the length of time the ionizers run in order to balance the ions in the space or room. If the ionizers need to run for 45 minutes while producing negative ions, but only need to run for 10 minutes while producing positive ions, this may be an indication that the ionizers are not producing negative ions as efficiently as they should be. Additionally or alternatively, this may be an indication that something in the space or room (e.g., a machine) is causing the significant imbalance of positive ions to negative ions, which is resulting in the need for significantly more negative ions. The real-time monitoring and data logging capabilities of ionizer system 10, specifically through the use of sensor 50, allows the efficiencies of the ionizers to be determined quickly and effectively, and allows deficiencies in machines to be detected.

Figure 10:
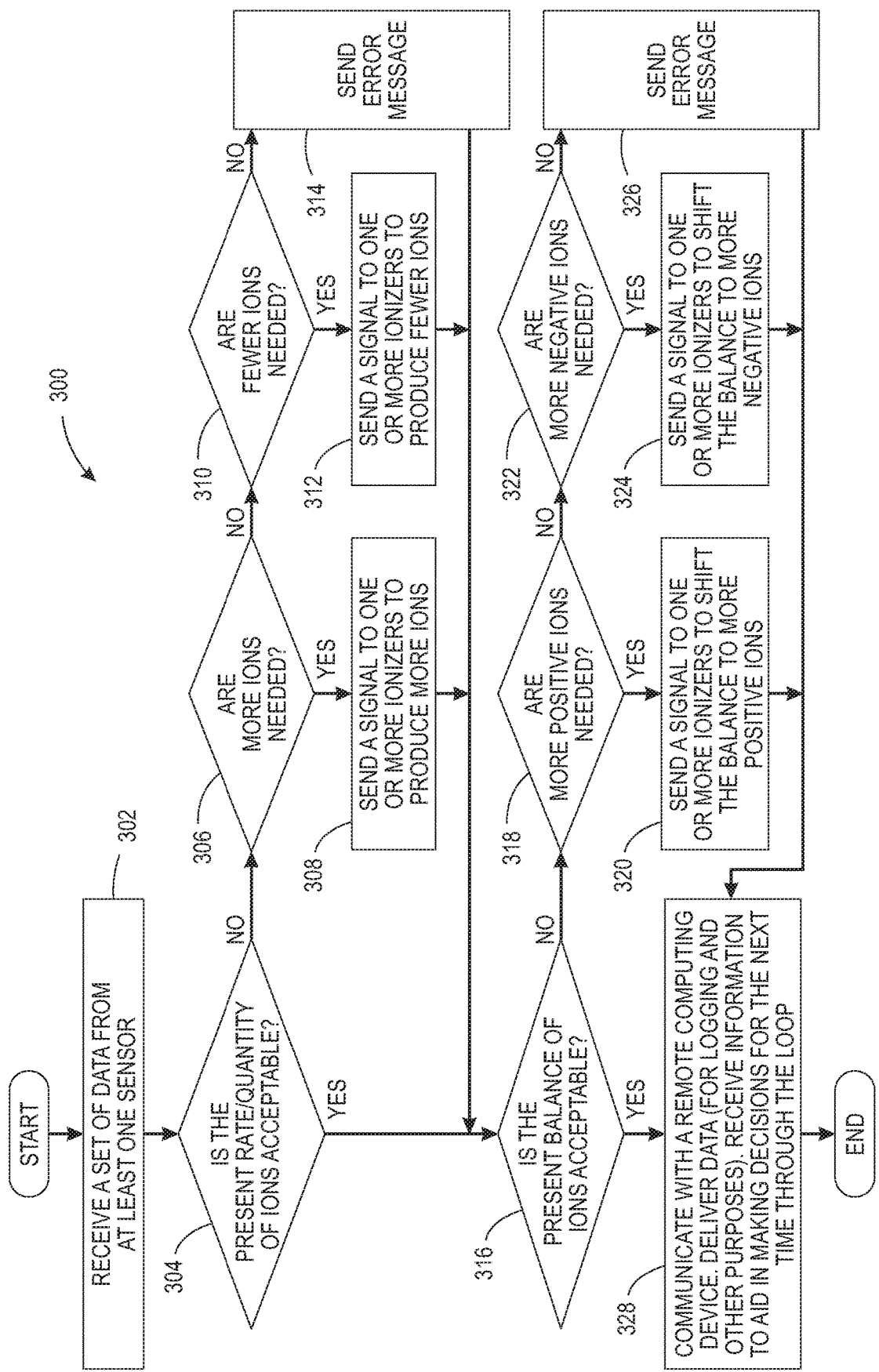
FIG. 10 is a flow chart of a method of controlling the ionizer system of FIG. 1.

FIG. 10 shows flow chart 300 outlining a method of controlling ionizer system 10. It should be appreciated that flow chart 300 can be utilized with any ionizer system and that this disclosure should not be limited to its use with only ionizer system 10. The method is performed by controller 110, which is in communication with whole room ionizer 20, individual ionizer 30, senor 50, and remote computing device 40.

In step 302, controller 50 receives a set of data from sensor 50. The data may be received via electrical conduit 12 (i.e., hardwired connection) or via a wireless transmission sent by transmitter 51 (i.e., wireless connection).

In step 304, controller 50 determines if the present rate and/or quantity of ions in the space or room is acceptable. Specifically, the quantity of ions may be measured as the number of ions per volume of space. The rate of ions may be measured as the amount of ions being produced by the ionizers per unit of time.

If the present rate and/or quantity of ions is not acceptable, then in step 306, controller 50 determines if more ions are needed. If more ions are needed, then in step 308, controller 50 sends a signal to whole room ionizer 20 and/or individual ionizer 30 to produce more ions. If more ions are not needed, then in step 310, controller 50 determines if fewer ions are needed. If fewer ions are needed, then in step 312, controller 50 sends a signal to whole room ionizer 20 and/or individual ionizer 30 to produce fewer ions. If controller 50 determines that the present rate and/or quantity of ions is not acceptable, that more ions are not needed, and that fewer ions are not needed, then in step 314 controller 50 sends a signal that an error in ionizer system 10 has occurred. Controller 50 may, for example, send a signal to a remote location through event detector port 116 and/or indicate a system error via indicator lights 126/128.

If more ions are not needed, then in step 316, controller 50 determines if there is an ion imbalance in the space or room. Specifically, controller 50 determines if the present balance of ions is acceptable. For example, if the level of positive ions is equal to the level of negative ions, then there is no ion imbalance. If the level of positive ions is not equal to the level of negative ions, then there is an ion imbalance. It should be appreciated that alpha ionizers typically produce a balanced level of ions in the space or room because alpha ionizers are inherently balanced. As such, in some embodiments, alpha ionizers may be used to limit the ion imbalance of ionizer system 10.

If the present balance of ions is acceptable (i.e., there is no ion imbalance), then in step 328, controller 50 sends a communication to remote computing device 40. Computing device 40 logs this communication (i.e., at that particular moment in time there was no ion imbalance). Additionally, if there is no ion imbalance, controller 50 may send a signal to whole room ionizer 20 and/or individual ionizer 30 to produce a balanced quantity of positive and negative ions. It should be appreciated that in step 328, controller 50 communicates with remote computing device 40 and delivers data to remote computing device 40 for logging and other purposes (e.g., analysis). Additionally in step 328, controller 50 may receive information to aid in making decision for the next loop of flow chart 300, for example, receiving updates to the system.

If the present balance of ions is not acceptable (i.e., there is an ion imbalance), then in step 318, controller 50 determines if more positive ions are needed. If the level of positive ions is less than the level of negative ions, then more positive ions are needed. If the level of positive ions is greater than or equal to the level of negative ions, then more positive ions are not needed.

If more positive ions are needed, then in step 320, controller 50 sends a signal to whole room ionizer 20 and/or individual ionizer 30 to produce positive ions or shift the balance of ion production to more positive ions.

If more positive ions are not needed, then in step 322, controller 50 determines if more negative ions are needed. If the level of negative ions is less than the level of positive ions, then more negative ions are needed. If the level of negative ions is greater than or equal to the level of positive ions, then more negative ions are not needed. It should be appreciated that this step may be removed from the method because, if controller 50 determines that there is an ion imbalance in step 316, and also determines that more positive ions are not needed in step 318, then by logic more negative ions must be needed (unless there is an error in the system).

If more negative ions are needed, then in step 324, controller 50 sends a signal to whole room ionizer 20 and/or individual ionizer 30 to produce negative ions or shift the balance of ion production to more negative ions.

If more negative ions are not needed, then in step 326, controller 50 sends a signal that an error in ionizer system 10 has occurred. Controller 50 may, for example, send a signal to a remote location through event detector port 116 and/or indicate a system error via indicator lights 126/128.

After controller 50 has sent a signal either in step 308, step 312, step 314, step 320, step 324, or step 326, controller 50 sends a communication to computing device 40 (similar to that as previously discussed with respect to step 328). Computing device 40 logs the communication. The data that is logged by computing device 40 can then be analyzed and compiled to determine the efficiency of the ionizers, the calibration of the sensors, and any defects in the system producing an excessive charge in the space or room (e.g., a faulty machine).

It should be appreciated that there are various methods of increasing the level of positive ions relative to negative ions and also increasing the level of negative ions relative to positive ions. For example, if more negative ions are needed, controller 50 may stop the production of positive ions and continue to produce negative ions, reduce the production of positive ions and continue to produce negative ions, stop the production of positive ions and increase the production of negative ions, or reduce the production of positive ions and increase the production of negative ions. If more positive ions are needed, controller 50 may stop the production of negative ions and continue to produce positive ions, reduce the production of negative ions and continue to produce positive ions, stop the production of negative ions and increase the production of positive ions, or reduce the production of negative ions and increase the production of positive ions.

Figure 11:
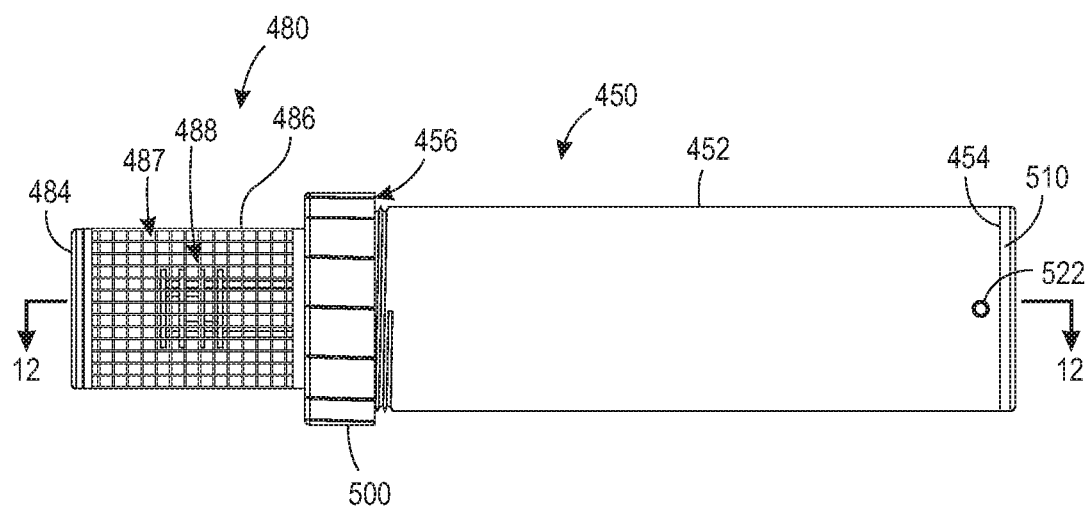
FIG. 11 is an elevational view of a sensor.
Figure 12:
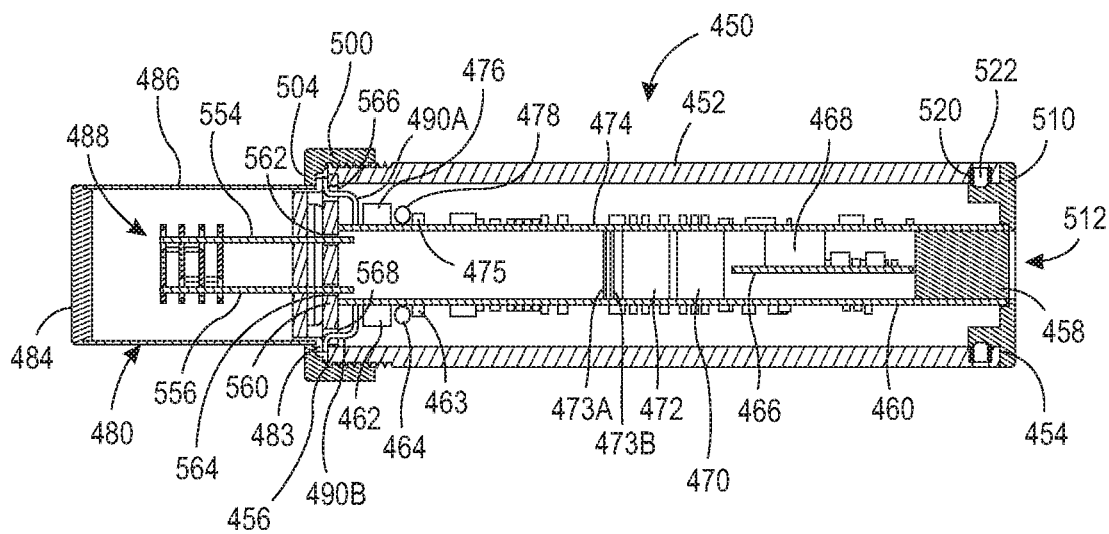
FIG. 12 is a cross-sectional view of the sensor, taken generally along line 12-12 in FIG. 11.
Figure 13:
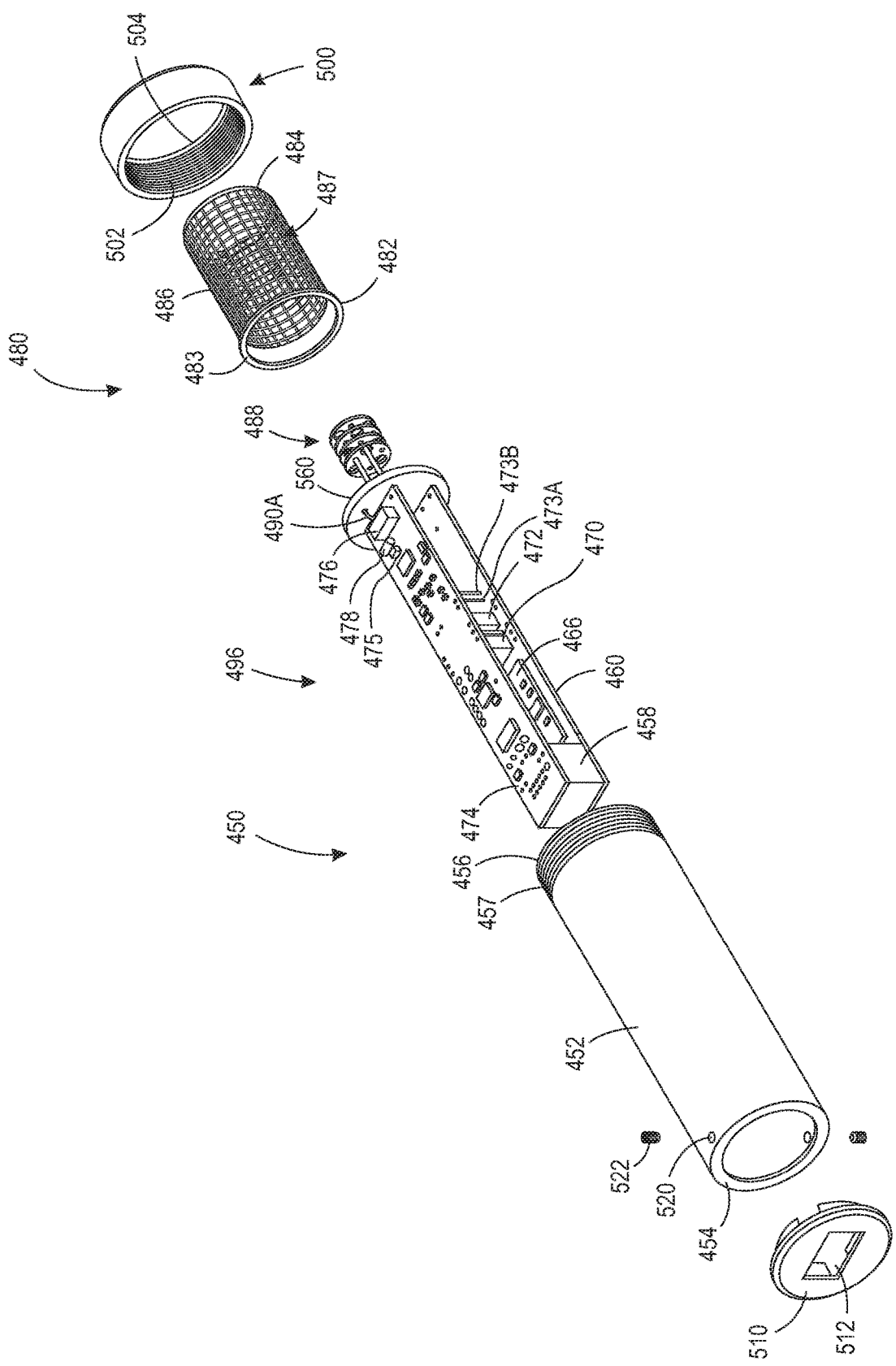
FIG. 13 is an exploded perspective view of the sensor shown in FIG. 11.
Figure 14A:
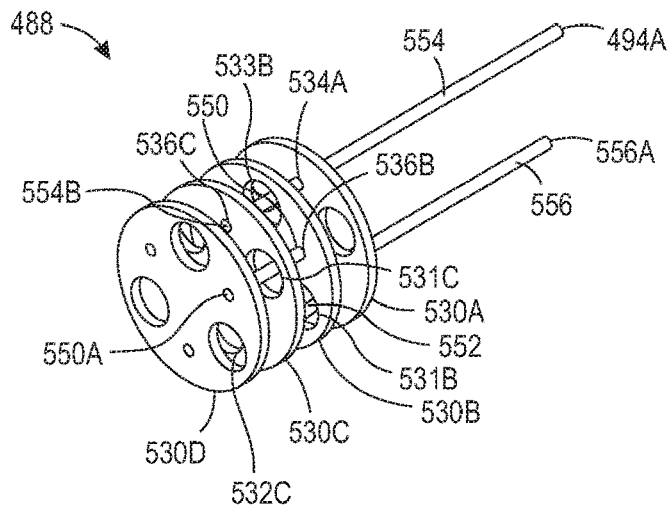
FIG. 14A is a perspective view of a core assembly, as shown in FIG. 13.
Figure 14B:
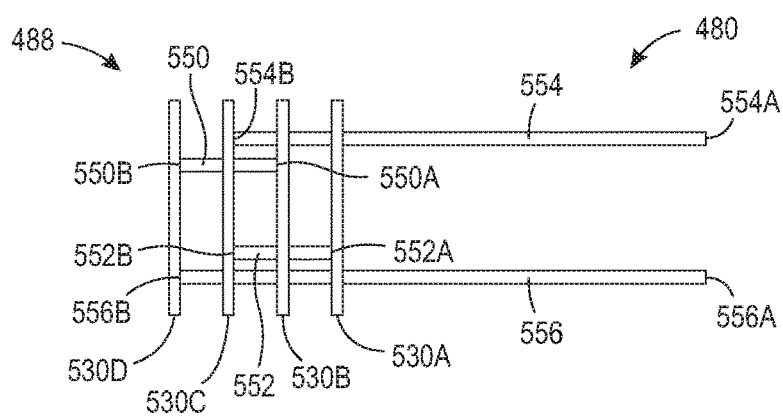
FIG. 14B is a side elevational view of the core assembly shown in FIG. 14A; and, FIG. 14C is a front elevational view of the core assembly shown in FIG. 14A.
Figure 14C:
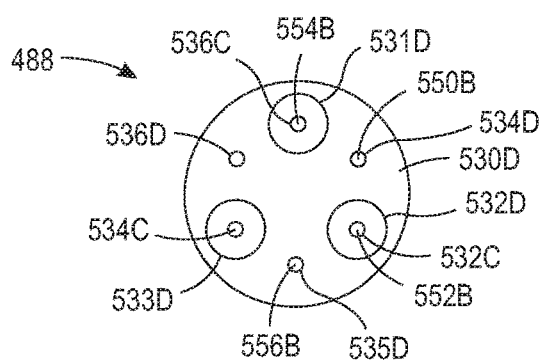

FIG. 11 is an elevational view of sensor 450. FIG. 12 is a cross-sectional view of sensor 450, taken generally along line 12-12 in FIG. 11. FIG. 13 is an exploded perspective view of sensor 450. FIG. 14A is a perspective view of core assembly 488. FIG. 14B is a side elevational view of core assembly 488. FIG. 14C is a front elevational view of core assembly 488. Sensor 450 generally comprises housing 452, ion sensor 480, and circuit board assembly 496. Sensor 450 may be used in ionizer system 10 either in place of or in addition to sensor 50. Sensor 450 performs substantially the same function as sensor 50 and can be implemented in ionizer system 10, shown in FIG. 1, instead of or in addition to sensor 50. Sensor 450 compares positive and negative ions in the space or room and sends that information to controller 110. The following description should be read in view of FIGS. 12-14C.

Housing 452 is generally cylindrical and comprises end 454 and end 456. Housing 452 is preferably a conductive metal shielding that at least partially forms a Faraday shield around circuit board assembly 496, which is housed therein. A Faraday shield or Faraday cage (as discussed below) is an enclosure used to block electromagnetic fields. A Faraday shield may be formed by a continuous covering of conductive material or in the case of a Faraday cage, by a mesh of such materials. As such, housing 452 prevents interference with the sensitive circuitry of circuit board assembly 496. In some embodiments, housing 452 comprises stainless steel. In some embodiments, housing 452 comprises a plastic shell that is internally coated with a metal. End 454 comprises port 458. Sensor 450 is connected to controller 110 through port 458 via electrical conduit 12. In some embodiments, port 458 is a RJ 45 connector. However, it should be appreciated that port 458 may comprise any connector suitable for providing an interface between sensor 450 and controller 110. In some embodiments, sensor 450 communicates with controller 110 via transmitter 51. Sensor 450 may further comprise cap 510 which is removably connected to end 454. Cap 510 comprises opening 512 which allows electrical connection to port 458. In some embodiments, cap 510 is connected to end 450 via one or more set screws 522 engaged in one or more holes 520. In some embodiments, cap 510 is connected to end 450 via an interference or friction fit. Sensor 450 may further comprise threading 457 proximate end 456.

Ion sensor 480 extends from housing 452. Ion sensor 480 comprises cage 486 and core assembly 488. Cage 486 is connected to end 456 via, for example, nut 500. Cage 486 comprises end 482 including flange 483 and end 484. In some embodiments, ion sensor 480 does not comprise cage 486. Nut 500 comprises threading 502 and flange 504. Flange 483 is arranged to abut against end 456 or plate 560. Nut 500 is then secured to housing 452, namely, threading 502 engages threading 457 and flange 504 clamps flange 483 against end 456 and/or plate 560. It should be appreciated that any suitable method for securing cage 486 to housing 456 may be used, for example, set screws, adhesives, soldering, welding, bolts, etc. The material of cage 486 is such that it aids in creating a Faraday cage as discussed further below.

Core assembly 488 comprises one or more plates and a plurality of rods. Specifically, core assembly comprises plates 530A-D and rods 550, 552, 554, and 556. It should be appreciated, however, that core assembly 488 may comprise any number of plates and rods suitable for measuring ionic charge. As shown in the figures, plates 530A-D are arranged adjacent each other and are substantially the same. Plate 530A comprises holes 531A, 532A, 533A, 534A, 535A, and 536A. Plate 530B comprises holes 531B, 532B, 533B, 534B, 535B, and 536B. Plate 530C comprises holes 531C, 532C, 533C, 534C, 535C, and 536C. Plate 530D comprises holes 531D, 532D, 533D, 534D, 535D, and 536D. As shown in FIG. 14C, holes 531D, 532D, and 533D are larger than holes 534D, 535D, and 536D. Plates 530A-C include this same arrangement with respect to their respective holes. Smaller holes 534D, 535D, and 536D are arranged for connection to respective rods, whereas larger holes 531D, 532D, and 533D must be large enough such that respective rods can pass therethrough and charge in plate/rod does not leak into the passthrough rod/plate. Specifically, rod 554 comprises ends 554A and 554B. Rod 554 is connected to plate 530A at a point between ends 554A and 554B, passes through larger hole 533B in plate 530B, and is connected to plate 530C at end 554B. Rod 554 may be connected to plates 530A and 530C via any suitable method, such as soldering, welding, adhesives, interference or friction fit, etc. The clearance between rod 554 and plate 530B formed by larger hole 533B prevents any significant transfer of charge therebetween. Rod 556 comprises ends 556A and 556B. Rod 556 passes through larger hole 533A in plate 530A, is connected to plate 530B at a point between ends 556A and 556B, passes through larger hole 532C in plate 530C, and is connected to plate 530D at end 556B. Rod 556 may be connected to plates 530B and 530D via any suitable method, such as soldering, welding, adhesives, interference or friction fit, etc. The clearance between rod 556 and plate 530A formed by larger hole 533A and between rod 556 and plate 530C formed by hole 532C prevents any significant transfer of charge therebetween. Rod 550 comprises ends 550A and 550B. Rod 550 is connected to plate 530B at end 550A, passes through larger hole 531C in plate 530C, and is connected to plate 530D at end 550B. Rod 550 may be connected to plates 530B and 530D via any suitable method, such as soldering, welding, adhesives, interference or friction fit, etc. The clearance between rod 550 and plate 530C formed by larger hole 531C prevents any significant transfer of charge therebetween. Rod 552 comprises ends 552A and 552B. Rod 552 is connected to plate 530A at end 552A, passes through larger hole 531B in plate 530B, and is connected to plate 530C at end 552B. Rod 552 may be connected to plates 530A and 530C via any suitable method, such as soldering, welding, adhesives, interference or friction fit, etc. The clearance between rod 552 and plate 530B formed by larger hole 531B prevents any significant transfer of charge therebetween. It should be appreciated, that rods 554 and 556 do not need to be rigid bars, but can instead be any suitable electrical conductor, for example, wires. In some embodiments, core assembly 488 does not comprise any plates, and instead only comprises rod or electrical conductor 554 and rod or electrical conductor 556. In some embodiments, core assembly 488 comprises one or more plates. For example, in some embodiments core assembly 488 comprises sixteen plates arranged adjacent each other. In this example embodiment, from right to left as in the arrangement of FIG. 14B (can be visualized as plates 530A-P), the first, third, fifth, seventh, ninth, eleventh, thirteenth, and fifteenth plates are connected to rod 554 and rod 552. The second, fourth, sixth, eighth, tenth, twelfth, fourteenth, and sixteenth plates are connected to rod 556 and rod 550.

Respectively connected rods and plates are charged with a voltage. For example, rod 554, rod 552, plate 530A, and plate 530C are electrically connected and form a first line. Rod 556, rod 550, plate 530B, and plate 530D are electrically connected and form a second line.

One of the first and second lines (e.g., first line: rod 554, rod 552, plate 530A, and plate 530C) is charged to a voltage of approximately +35V and the other of the first and second lines (e.g., second line: rod 556, rod 550, plate 530B, and plate 530D) is charged to a voltage of approximately −35V. However, it should be appreciated that the precise voltage may be adjusted for various reasons, including adjusting sensitivity, calibration, or to accommodate specific requirements of the user. In some embodiments, the first line (i.e., rod 554, rod 552, plate 530A, and plate 530C) comprises a positive charge and, when impacted by negative ions, gains electrons. The first line, specifically, rod 554, is connected to circuit board 474 which comprises a transimpedance amplifier that converts this ion current into a voltage. Similarly, the second line (i.e., rod 556, rod 550, plate 530B, and plate 530D) comprises a negative charge and, when impacted by positive ions, loses electrons. The second line, specifically, rod 556, is connected to circuit board 460 which comprises a transimpedance amplifier that converts this current to a voltage. It should be appreciated that in some embodiments, first line (i.e., rod 554, rod 552, plate 530A, and plate 530C) may comprise a negative charge and the second line (i.e., rod 556, rod 550, plate 530B, and plate 530D) may comprise a positive charge. These voltages are filtered, amplified, conditioned, and ultimately digitized by an ADC. The resulting digitized values are processed through proprietary algorithms to produce a result equivalent to the discharge time measured by a CPM. The measurements are also processed through a different proprietary algorithm to determine the DC balance of the ionizing system. If an uncharged CPM is placed in an ionizing stream, ideally, the plate would remain at zero volts with respect to ground, but many ionizers produce a slight imbalance in their ion streams, resulting in the charged plate monitor receiving a small positive or negative charge. This sensor technology can also measure this DC offset, essentially by comparing the results of the positive and negative helix currents. In some embodiments, rod 554 engages plate 560, specifically hole 562, and is electrically connected to circuit board 474 via, for example, wire 492 (not shown). Rod 556 engages plate 560, specifically hole 564, and is electrically connected to circuit board 460 via, for example, wire 494 (not shown). It should be appreciated that rods 554 and 556 may be electrically connected to circuit boards 474 and 460, respectively, via any suitable means. In some embodiments, wires 492 and 494 are uninsulated, low corrosion, gold plated wires. Wire 492 is connected to circuit board 474 via any suitable method, for example, soldering. Wire 494 is connected to circuit board 460 via any suitable method, for example, soldering. The core assembly ion sensor design of the present disclosure functions to provide real-time, direct measurement of ion current, and low noise/leakage.

Cage 486 is a metal (conductive) shield having openings 487 to allow airflow to core assembly 488. Cage 486 forms a Faraday cage which protects rod 550, rod 552, rod 554, rod 556, and plates 530A-D from electric fields that would otherwise affect the readings. Cage 486 is connected to the electrical ground plane of the sensor circuit boards, for example, an electrical ground plane (not shown) within circuit board 474, via wire 490A and/or an electrical ground plane (not shown) within circuit board 460, via wire 490B. As shown, a first end of wire 490A is arranged between (e.g., clamped between) flange 483 of cage 486 and plate 560, extends through hole 566 in plate 560, and a second end of wire 490A is connected to the electrical ground plane of circuit board 474. Similarly, a first end of wire 490B is arranged between (e.g., clamped between) flange 483 of cage 486 and plate 560, extends through hole 568 in plate 560, and a second end of wire 490B is connected to the electrical ground plane of circuit board 460. Furthermore, the electrical ground plane in circuit board 474 and the electrical ground plane in circuit board 460 are connected via one or more conductive pins, shown as pins 473A and 473B. Pins 473A and 473B extend from circuit board 460 to circuit board 474 to electrically connect the ground planes arranged in circuit board 460 and circuit board 474. The ground planes in circuit boards 460 and 474 help reduce the influence of external noise sources from interrupting the circuitry of circuit board assembly 496. The ground planes of the circuit boards keep sensitive analog circuits operating at low noise capability. It should be appreciated that any number of pins suitable for connecting the ground planes to reduce the external noise affecting the circuitry may be used. In some embodiments, cage 486 is arranged as a mesh shield that attenuates external electromagnetic waves before they reach core assembly 488, yet allows ions to flow therethrough. Openings 487 may comprise a square, hexagonal, circular, or irregular polygon geometry, or any other suitable geometry. In some embodiments, cage 486 is left ungrounded and is used to measure the offset voltage of the ion stream. In some embodiments, ion sensor 480 does not comprise cage 486, but rather only core assembly 488.

Circuit board assembly 496 generally comprises circuit board 460, circuit board 474, and circuit board 466, which are all connected to port 458. Circuit boards 460, 474, and 466 may be printed circuit boards (PCBs). Power inductor 468 is arranged between circuit board 466 and circuit board 474. However, power inductor 468 may be arranged at any suitable location relative to circuit boards 466 and 474. Circuit board 466 and power inductor 468 are arranged to regulate the power supplied to sensor 450. Circuit board 460 comprises inter alia, control relay 462, gain-control resistor 464, filter capacitor 463, and a transimpedance amplifier, and is connected to wire 490B and rod 556. Circuit board 460 is arranged to convert current in rod 556 to a voltage, and subsequently filter, amplify, condition, and digitize that voltage. Similarly, circuit board 474 comprises inter alia, control relay 476, gain-control resistor 478, filter capacitor 475, and a transimpedance amplifier, and is connected to wire 490A and rod 554. Circuit board 474 is arranged to convert current in rod 554 to a voltage, and subsequently filter, amplify, condition, and digitize that voltage. The digitized sets of data created by circuit boards 460 and/or 474 are then converted to a serial message format and transmitted via RS-485 (or another communication means) to controller 110. The level of DC balance determined by sensor 450 will be used by controller 110 to send information to an ionizer, adjusting it to ensure optimal protection against electrical charge buildup, as previously discussed. It should be appreciated that sensor 450 interacts with controller 110 either via hardwire or transmitter 51 is substantially the same way as sensor 50.

It will be appreciated that various aspects of the disclosure above and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

REFERENCE NUMERALS

2 Machine
10 Ionizer system
12 Electrical conduit
20 Whole room ionizer
22 Receiver
30 Individual ionizer
32 Receiver
40 Computing device
42 Receiver
44 Transmitter
50 Sensor
51 Transmitter
52 Housing
54 End
56 End
58 Port
60 Circuit board
62 Control relay
63 Filter capacitor
64 Gain-control resistor
66 Circuit board
68 Power Inductor
70 Capacitor
72 Capacitor
73A Pin
73B Pin
74 Circuit board
75 Filter capacitor
76 Control relay
78 Gain-control resistor
80 Ion sensor
82 End
84 End
86 Cage
87 Openings
88 Core
90 Wire
92 Wire
94 Wire
96 Circuit board assembly
110 Controller
112 Housing
112A Bottom portion
112B Top portion (not shown)
114 Circuit board
116 Event detector port
118 Ionizer port
120 Sensor port
122 Optional port
124 Mode button
126 Indicator light
128 Indicator light
130 Antenna port
132 Power port
134 Optional communication port
136 Programming port
138 Data aggregator
140 Universal Serial Bus (USB) ports
142 Audio/composite video port
144 High-Definition Multimedia Interface (HDMI) port
146 Micro Universal Serial Bus (USB) port
210 Controller
212 Housing
212A Bottom portion
212B Top portion
214 Circuit board
216 Event detector port
218 Ionizer port
220 Sensor port
222 Optional port
224 Mode button
226 Indicator light
228 Indicator light
230 Antenna port
232 Power port
234 Optional communication port
236 Programming port
238 Data aggregator
240 Universal Serial Bus (USB) ports
242 Audio/composite video port
244 High-Definition Multimedia Interface (HDMI) port
246 Micro Universal Serial Bus (USB) port
250 Receiver
252 Transmitter
300 Flow chart
302 Step
304 Step
306 Step
308 Step
310 Step
312 Step
314 Step
316 Step
318 Step
320 Step
322 Step
324 Step
326 Step
328 Step
450 Sensor
451 Transmitter (not shown)
452 Housing
454 End
456 End
557 Threading
458 Port
460 Circuit board
462 Control relay
463 Filter capacitor
464 Gain-control resistor
466 Circuit board
468 Power Inductor
470 Capacitor 472 Capacitor
473A Pin
473B Pin
474 Circuit board
475 Filter capacitor
476 Control relay
478 Gain-control resistor
480 Ion sensor
482 End
483 Flange
484 End
486 Cage
487 Openings
488 Core assembly
490A Wire
490B Wire
492 Wire (not shown)
494 Wire (not shown)
496 Circuit board assembly
500 Nut
502 Threading
504 Flange
510 Cap
512 Opening
520 Hole(s)
522 Screw(s)
530A Plate
531A Hole
532A Hole
533A Hole
534A Hole
535A Hole p 536A Hole
530B Plate
531B Hole
532B Hole
533B Hole
534B Hole
535B Hole
536B Hole
530C Plate
531C Hole
532C Hole
533C Hole
534C Hole
535C Hole
536C Hole
530D Plate
531D Hole
532D Hole
533D Hole
534D Hole
535D Hole
536D Hole
550 Rod
550A End
550B End
552 Rod
552A End
552B End
554 Rod
554A End
554B End
556 Rod
556A End
556B End
560 Plate
562 Hole
564 Hole
566 Hole
568 Hole

What is claimed is:

1. A sensor for sensing ions, comprising:
   a circuit board assembly; and,
   a core assembly connected to the circuit board assembly, the core assembly including:
   a first electrical conductor;
   a second electrical conductor;
   a first plate including a first hole engaged with the first electrical conductor and a second hole engaged with the second electrical conductor, wherein the first electrical conductor and the first plate are charged with a positive voltage and operatively arranged to collect negative ions; and
   a second plate arranged adjacent to the first plate, the second plate including a third hole engaged with the first electrical conductor and a fourth hole engaged with the second electrical conductor, wherein the second electrical conductor and the second plate are charge with a negative voltage and operatively arranged to collect positive ions.

2. The sensor as recited in claim 1, further comprising a housing at least partially enclosing the circuit board assembly, the housing including a first end and a second end.

3. The sensor as recited in claim 2, further comprising a port connected to the circuit board assembly, the port arranged proximate the first end.

4. The sensor as recited in claim 1, further comprising a cage at least partially surrounding the core assembly and electrically connected to the circuit board assembly.

5. The sensor as recited in claim 4, wherein the circuit board assembly comprises:
   a first circuit board connected to the first electrical conductor; and,
   a second circuit board connected to the second electrical conductor.

6. The sensor as recited in claim 5, wherein the circuit board assembly further comprises a third circuit board.

7. The sensor as recited in claim 5, wherein the cage is electrically connected to a ground plane of at least one of the first circuit board and the second circuit board.

8. The sensor as recited in claim 1, wherein the core assembly further comprises:
   a third plate arranged adjacent to the second plate and connected to the first electrical conductor; and,
   a fourth plate arranged adjacent to the third plate and connected to the second electrical conductor.

9. The sensor as recited in claim 8, wherein the first plate, the second plate, the third plate, and the fourth plate are all arranged parallel to each other.

10. The sensor as recited in claim 5, further comprising:
    a third electrical conductor electrically connected to the second plate and the fourth plate, the third electrical conductor and the fourth plate are charged with a negative voltage and operatively arranged to collect positive ions; and,
    a fourth electrical conductor electrically connected to the first plate and the third plate, the fourth electrical conductor and the third plate are charged with a positive voltage and operatively arranged to collect negative ions.

11. The sensor as recited in claim 1, wherein the first and second electrical conductors are rods.

12. The sensor as recited in claim 1, wherein the first and second electrical conductors are wires.

13. The sensor as recited in claim 4, wherein the cage is secured to the housing.

14. The sensor as recited in claim 1, wherein the core assembly is arranged on a first axial side of a support plate and the circuit board assembly is arranged on a second axial side of the support plate, opposite the first axial side.

15. The sensor as recited in claim 1, wherein the first electrical conductor passes through the support plate to connect to the circuit board assembly.

16. A sensor for sensing ions, comprising:
    a circuit board assembly, including:
        a first circuit and,
        a second circuit;
    a core assembly connected to the circuit board assembly, the core assembly including:
        a first rod connected to the first circuit;
        a second rod connected to the second circuit;
        a first plate connected to the first rod, the first rod and the first plate charged with a positive voltage and operatively arranged to collect negative ions; and,
        a second plate connected to the second rod, the second rod and the second plate charged with a negative voltage and operatively arranged to collect positive ions; and,
    a cage at least partially surrounding the core assembly and electrically connected to the circuit board assembly.

17. The sensor as recited in claim 16, further comprising a housing at least partially enclosing the circuit board assembly, the housing including a first end and a second end.

18. The sensor as recited in claim 16, wherein the cage is electrically connected to a ground plane of at least one of the first circuit board and the second circuit board.

19. The sensor as recited in claim 16, wherein the core assembly further comprises:
    a third plate connected to the first rod; and,
    a fourth plate connected to the second rod;
    wherein the first, second, third, and fourth plates are arranged adjacent each other.

20. A sensor for sensing ions, comprising:
    a circuit board assembly; and,
    a core assembly connected to the circuit board assembly, the core assembly including:
        a first electrical conductor connected to the circuit board assembly;
        a second electrical conductor connected to the circuit board assembly;
        a first plate connected to the first electrical conductor, the first electrical conductor and the first plate charged with a positive voltage and operatively arranged to collect negative ions; and,
        a second plate connected to the second electrical conductor and arranged parallel to the first plate, the second electrical conductor and the second plate charged with a negative voltage and operatively arranged to collect positive ions.

* * * * *